United States Patent
Tanaka et al.

(10) Patent No.: US 8,304,323 B2
(45) Date of Patent: Nov. 6, 2012

(54) SEMICONDUCTOR ELEMENT MANUFACTURING METHOD

(75) Inventors: Thoru Tanaka, Saga (JP); Hiroshi Ogawa, Saga (JP); Mitsuhiro Nishio, Saga (JP)

(73) Assignee: Saga University, Saga (JP)

( * ) Notice: Subject to any disclaimer, the term of this patent is extended or adjusted under 35 U.S.C. 154(b) by 755 days.

(21) Appl. No.: 11/794,617

(22) PCT Filed: Jan. 5, 2005

(86) PCT No.: PCT/JP2005/000021
§ 371 (c)(1), (2), (4) Date: Oct. 17, 2008

(87) PCT Pub. No.: WO2006/072976
PCT Pub. Date: Jul. 13, 2006

(65) Prior Publication Data
US 2009/0209094 A1      Aug. 20, 2009

(51) Int. Cl.
*H01L 21/22* (2006.01)
(52) U.S. Cl. ........ 438/442; 438/510; 438/530; 438/558; 257/E21.135
(58) Field of Classification Search .......... None
See application file for complete search history.

(56) References Cited

U.S. PATENT DOCUMENTS

| | | | | |
|---|---|---|---|---|
| 6,133,588 A | * | 10/2000 | Ogihara et al. | 257/88 |
| 6,583,446 B1 | * | 6/2003 | Taninaka et al. | 257/93 |
| 6,791,257 B1 | * | 9/2004 | Sato et al. | 313/498 |

FOREIGN PATENT DOCUMENTS

| | | |
|---|---|---|
| JP | 2000-228540 | 8/2000 |
| JP | 2003-282943 | 10/2003 |

* cited by examiner

*Primary Examiner* — Mamadou Diallo
(74) *Attorney, Agent, or Firm* — Rader Fishman & Grauer, PLLC (57) ABSTRACT

[PROBLEMS] To provide a semiconductor element manufacturing method by which a semiconductor element having high accuracy and high function can be manufactured by controlling diffusion depth and diffusion concentration in a pn junction region with high accuracy. [MEANS FOR SOLVING PROBLEMS] A diffusion control layer (2) composed of a thin film of a substance having a smaller diffusion coefficient than that of a diffusion source (3) is formed between a surface of a substrate (1) and the diffusion source (3), and an element of the diffusion source (3) is permitted to thermally diffuse through the diffusion control layer (2). Thus, the diffusion depth and the diffusion concentration in the semiconductor region, which is formed on the surface portion of the substrate and has a conductivity type different from that of the substrate, can be highly accurately controlled, and the semiconductor element having high accuracy and high function can be manufactured.

12 Claims, 6 Drawing Sheets

SEMICONDUCTOR ELEMENT MANUFACTURING METHOD

TECHNICAL FIELD

The present invention relates to a semiconductor element manufacturing method for manufacturing a semiconductor element, and more particularly relates to such a semiconductor element manufacturing method which can control a p-n junction, produced by a thermal diffusion of impurities, with high accuracy.

BACKGROUND OF ART

Figure 5:
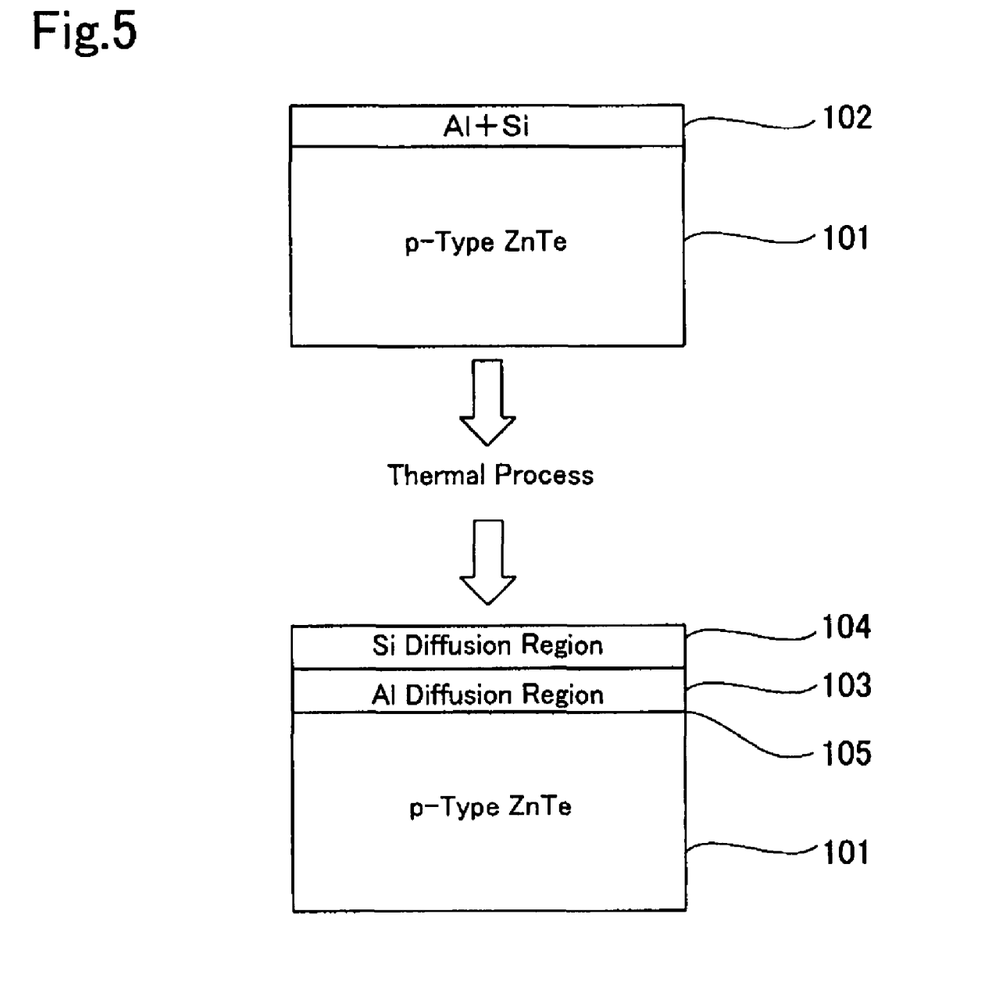
[FIG. 5] is a reference view showing a summary of a process of a prior art semiconductor element manufacturing method.

Conventionally, as this type semiconductor element manufacturing method, there is a manufacturing method for a photoelectric conversion function element, as disclosed in JP-2000-228540A, and this is illustrated in FIG. 5. In this drawing, the prior art semiconductor element manufacturing method is a method which includes: preparing a p-type ZnTe monocrystal substrate 101 which is a compound semiconductor crystal substrate composed of Zn of the twelfth group (2B) elements and Te of the sixteen group (6B) elements on the periodic table; placing a diffusion source 102, exhibiting the conductivity type (an n-type) different from the substrate 101 concerned, on a surface of the substrate 101; and subjecting the diffusion source 102 concerned to a thermal process to thereby produce a p-n junction 105 by the thermal diffusion. In this method, during the diffusion process, the diffusion source 102 placed on the surface of the aforesaid substrate 101 prevents production of defects compensating a level exhibiting the conductivity type different from the substrate 101, in the surface of the substrate 101 by the diffusion source 102, or is composed of substances (Al, Si) for gettering impurities on the surface of the substrate 101.

Like this, in the prior art semiconductor element manufacturing method, due to the fact that the diffusion source 102 placed on the surface of the aforesaid substrate 101 prevents production of defects in the surface of the substrate 101 by the diffusion source 102 to compensate a level exhibiting the conductivity type different form the substrate 101, or due to the effect of the gettering of the impurities on the surface of the substrate 101, it is possible to improve a purity of the crystal surface, and it is possible to improve controllability on a conductivity type of the II-VI group compound semiconductor by suppressing the self-compensation effect.

Figure 6:
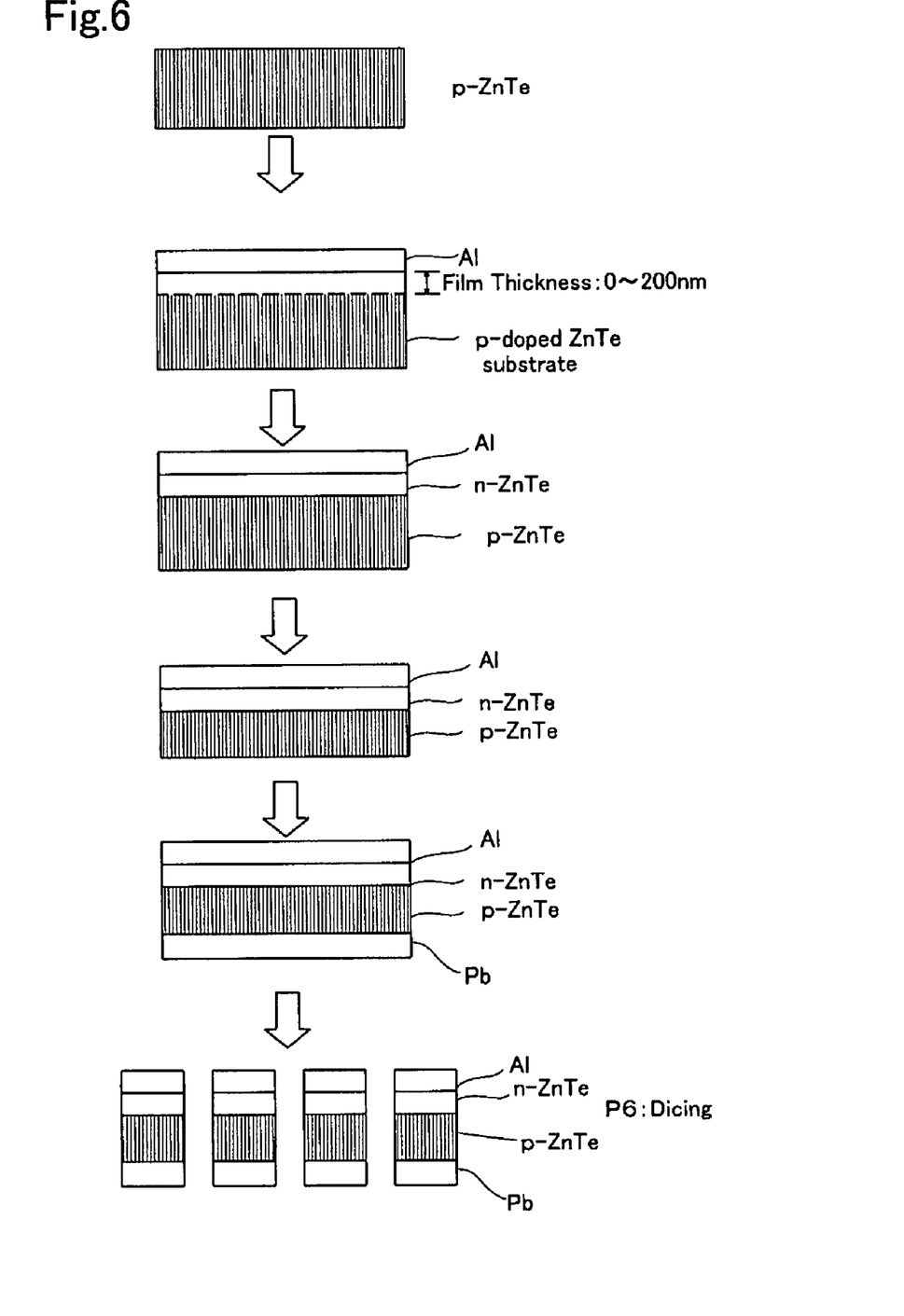
[FIG. 6] is a manufacture explanatory view of a prior art semiconductor element manufacturing method.

Also, as another prior art semiconductor element manufacturing method, there is a manufacturing method as disclosed in JP-2003-282943A, and this is illustrated in FIG. 6. In this drawing, the other prior art semiconductor element manufacturing method is a manufacturing method for a photoelectric conversion function element having a substrate composed of a II-VI group compound semiconductor crystal, and includes, in a process of forming a second conductivity type film layer on a surface of the aforesaid substrate having a first conductivity type, at least a process of producing a p-n junction by forming a first conductivity type film layer by doping of both an element causing a first conductivity type to the aforesaid semiconductor and an element causing a second conductivity type to the aforesaid semiconductor.

Like this, in the other prior art semiconductor element manufacturing method, by doping the II-VI group compound semiconductor with both the element causing the first conductivity type to the aforesaid semiconductor and the element causing the second conductivity type to the aforesaid semiconductor, and by controlling rates of the doped elements, it is possible to obtain superior advantages to suppress production of defects compensating a level exhibiting a desired conductivity type, i.e., the so-called self-compensation effect, and to improve controllability on a conductivity type of the II-VI group compound semiconductor. As a result, it is possible to manufacture an photoelectric conversion function element having a large light emission.

Patent Document 1: JP-2003-282943A
Patent Document 2: JP-2003-282943A

DISCLOSURE OF THE INVENTION

Problems to be Resolved by the Invention

Due to the fact that the prior art semiconductor element manufacturing methods are constituted as stated above, when the doping is carried out by the thermal diffusion, a diffusion depth and a diffusion density are controlled by both a diffusion temperature and a diffusion time, and thus the prior art methods involve a problem that the diffusion depth and the diffusion cannot be independently controlled preciously and accurately.

For example, in a case where a p-n junction type light emitting diode is manufactured by each of the aforesaid prior art semiconductor element manufacturing methods, since it is difficult to set electric conductivities of a p-type and an n-type of a II-VI group compound semiconductor in given values, there are problems that a light emission fluctuates, and is small. Also, in a case where another semiconductor element is manufactured, due to the fact that the electric conductivities of the p-type and the n-type cannot be accurately controlled, there is a problem that a function is unstable so that the semiconductor element cannot be properly driven.

The present invention is developed to resolve the aforesaid problems, and an object of the present invention is to provide a semiconductor element manufacturing method which can manufacture a high accurate and high functional semiconductor element by independently controlling a diffusion depth and a diffusion density at a p-n junction area with a high degree of accuracy.

Means for Solving the Problems

The semiconductor element manufacturing method according to the present invention manufactures a semiconductor element by: forming, on a surface of a substrate of a semiconductor crystal composed of an element causing one conductivity type; a diffusion source composed of an element causing another one conductivity type different from the one conductivity type; and carrying out a doping of the diffusion source by a thermal diffusion, wherein a diffusion control layer, formed of a film layer composed of a substance having a smaller diffusion coefficient than that of the diffusion source in the semiconductor crystal, is formed between the surface of the substrate and the diffusion source, and wherein the thermal diffusion of the elements of the diffusion source is carried out through the diffusion control layer.

Like this, in the present invention, since the diffusion control layer, formed of the film layer composed of a substance having a smaller diffusion coefficient than that of the diffusion source in the semiconductor crystal, is formed between the surface of the substrate and the diffusion source, and since the thermal diffusion of the elements of the diffusion source is carried out through the diffusion control layer, it is possible to independently control a diffusion depth and a diffusion density with high accuracy in a semiconductor region which is formed at a boundary portion between the substrate and the diffusion source, and which has a conductivity type different from that of the substrate, whereby a semiconductor element can be manufactured with high accuracy and high function.

Also, the semiconductor element manufacturing method according to the present invention is constituted such that the diffusion control layer is formed as either an oxide layer or a nitride layer, if necessary.

Like this, in the present invention, since the diffusion control layer is formed as either an oxide layer or a nitride layer, by either selecting a material substance of an oxide layer or a nitride layer or setting a thickness thereof, it is possible to independently control the diffusion depth and the diffusion density with high accuracy in the semiconductor region formed between the substrate 1 and the diffusion control layer 2, whereby a semiconductor element can be manufactured with high accuracy and high function.

Also, the semiconductor element manufacturing method according to the present invention is constituted such that the film layer is formed so as to regulate a thickness of the film layer in accordance of a solid solubility limit loi and a diffusion coefficient of the element of the diffusion source in the diffusion control layer, if necessary.

Like this, in the present invention, since the film layer is formed so as to regulate the thickness of the film layer in accordance of the solid solubility limit and the diffusion coefficient of the element of the diffusion source in the diffusion control layer, it is possible to independently control the diffusion depth and the diffusion density with high accuracy in the semiconductor region, whereby a semiconductor element can be manufactured with high accuracy and high function.

Also, the semiconductor element manufacturing method according to the present invention is constituted such that the film layer of the diffusion control layer is formed so as to have a thickness of 0.1 nm to 100 nm, if necessary.

Like this, in the present invention, since the film layer of the diffusion control layer is formed so as to have the thickness of 0.1 nm to 100 nm, by the setting of the thickness of the film layer, it is possible to independently control the diffusion depth and the diffusion density with high accuracy in the semiconductor region, whereby a semiconductor element can be manufactured with high accuracy and high function.

Also, the semiconductor element manufacturing method according to the present invention is constituted such that the substrate is composed of a II-VI group compound semiconductor, such that the diffusion source is composed of an n-type impurity, and such that that the diffusion control layer is formed as the film layer composed of a substance having a smaller diffusion coefficient than that of the n-type impurity.

Like this, in the present invention, since the substrate is composed of the II-VI group compound semiconductor, since the diffusion source is composed of the n-type impurity, and since the diffusion control layer is formed as the film layer composed of the substance having the smaller diffusion coefficient than that of the n-type impurity, it is possible to independently control the diffusion depth and the diffusion density with high accuracy in production of a light emitting diode, whereby it is possible to manufacture the light emitting diode from which a pure green light can be output with uniform emission and high accuracy.

THE BEST MODE FOR EMBODYING THE INVENTION (First Embodiment of the Invention)

Figure 1:
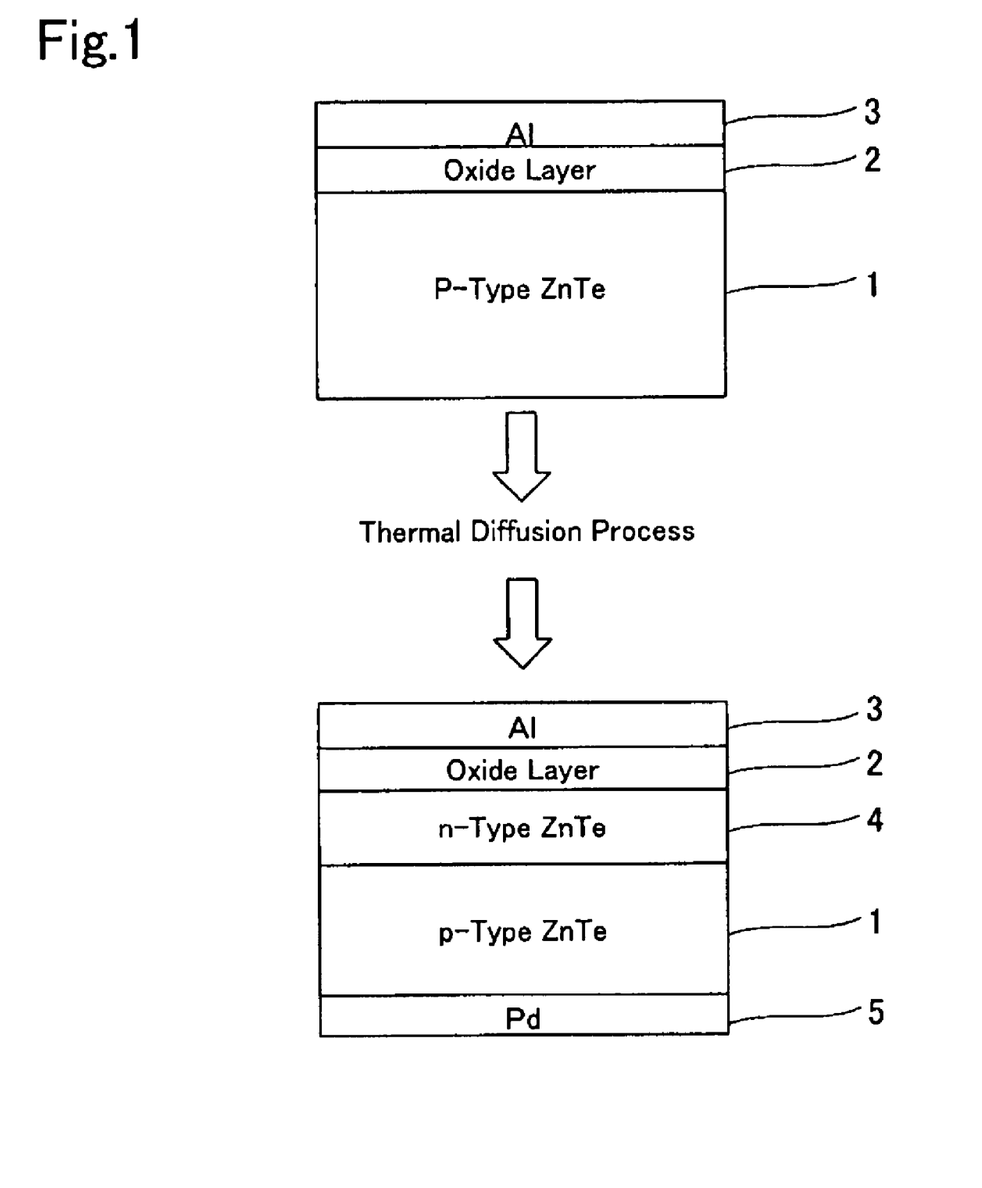
[FIG. 1] is a manufacture explanatory view of the semiconductor element manufacturing method according to the present invention.
Figure 2:
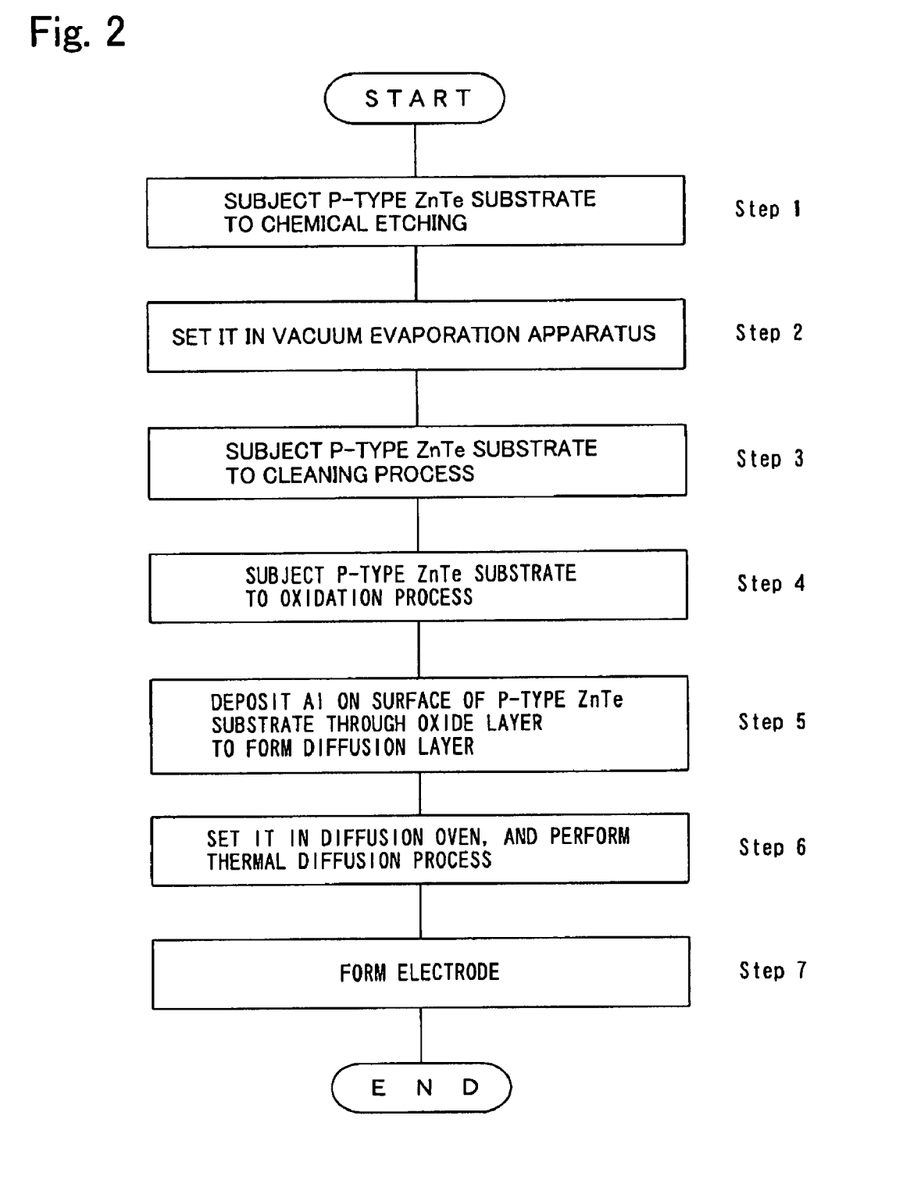
[FIG. 2] is a manufacture flowchart of manufacture processes of the semiconductor element manufacturing method shown in FIG. 1.
Figure 3:
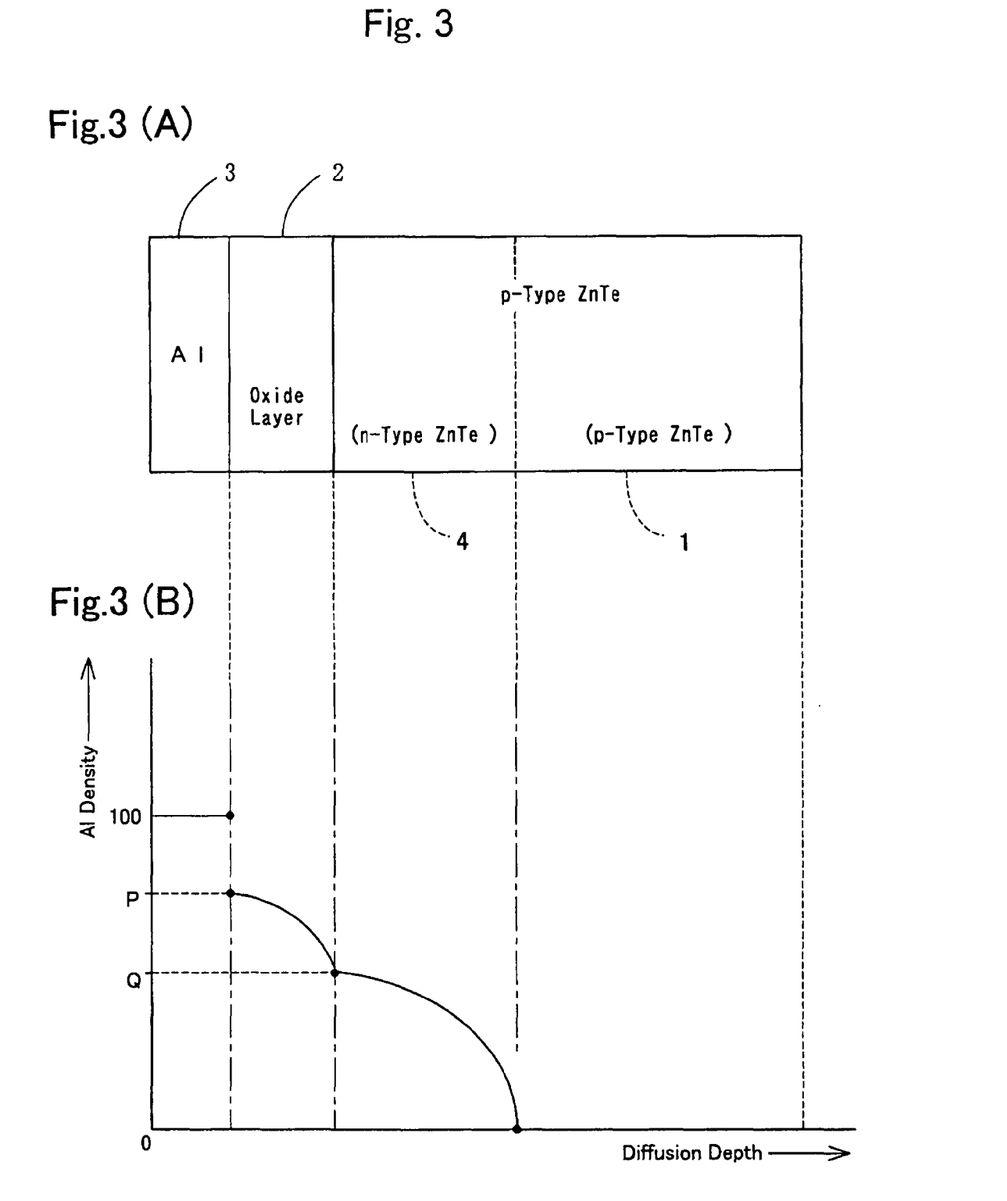
[FIG. 3] is a characteristic diagram of an Al-density/diffusion-depth in a thermal diffusion process of the semiconductor element manufacturing method shown in FIG. 1.
Figure 4:
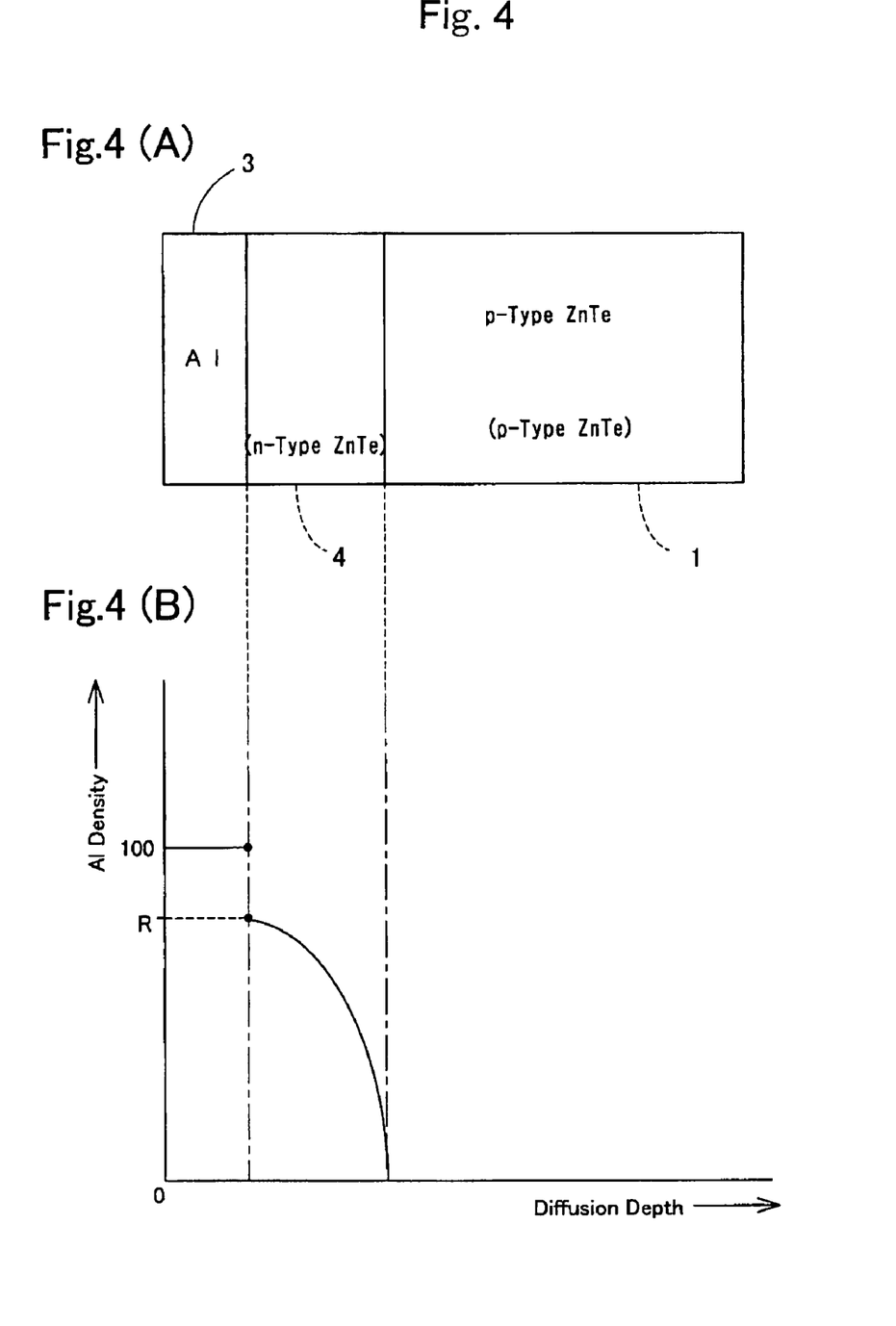
[FIG. 4] is a characteristic diagram of the prior art semiconductor element manufacturing method, corresponding to the characteristic diagram shown in FIG. 2.

A case where a semiconductor element manufacturing method of a first embodiment according to the present invention is applied to a manufacture of a green light emitting diode is explained based on FIGS. 1 to 3 hereinafter. FIG. 1 is a manufacture explanatory view of the semiconductor element manufacturing method according to the present invention, FIG. 2 is a manufacture flowchart of manufacture processes of the semiconductor element manufacturing method shown in FIG. 1, FIG. 3 is a characteristic diagram of an Al-density/diffusion-depth in a thermal diffusion process of the semiconductor element manufacturing method shown in FIG. 1, and FIG. 4 is a characteristic diagram of the prior art semiconductor element manufacturing method, corresponding to the characteristic diagram shown in FIG. 2.

In each of the aforesaid drawings, the semiconductor element manufacturing method of this embodiment includes a process for manufacturing a p-n junction light emitting diode by forming a diffusion source 3, composed of aluminum Al causing an n-type conductivity, on a surface of a p-type conductivity substrate 1 which is a metal compound semiconductor (referred to as a p-type ZnTe) composed of zinc Zn and tellurium Te, and by carrying out a doping of the diffusion source 3 by a thermal diffusion, with a diffusion control layer 2 (e.g., an oxide layer obtained by oxidizing zinc Zn and tellurium Te of the aforesaid substrate 1 and aluminum Al of the aforesaid diffusion source 3) composed of a substance having a smaller diffusion coefficient than that of aluminum Al of the diffusion source 3 at ZnTe being formed between the aforesaid substrate 1 and the surface of the aforesaid substrate, with aluminum Al being thermally diffused and doped in the substrate 1 through the oxide layer of the diffusion layer 2 by heating the aforesaid diffusion source 3.

Next, the light emitting diode manufacturing process of the semiconductor element manufacturing method is explained based on the aforesaid constitution. First, the surface of the substrate 1 is subjected to a chemical etching so that a strain layer remaining in the crystal is removed with a thickness of several μm to several ten μm (step 1). In this chemical etching, either an acid-based etchant or an alkali-based etchant may be used as an etchant, and a process of forming an oxide layer on the ZnTe surface of the substrate 1, and a process of removing the oxide layer are repeated carried out.

The etched substrate 1 is set in a vacuum evaporation apparatus (not shown), and an interior of the vacuum evaporation apparatus is evacuated until a pressure of less than $1 \times 10^{-8}$ Torr is created therein (step 2). In this vacuum state, the surface of the substrate 1 is subjected to a cleaning process with using hydrogen radical (step 3). The processing state in this cleaning process may be confirmed by a reflection high speed electron beam diffraction apparatus.

By irradiating the surface of the substrate 1, subjected to the cleaning process, with oxygen radical, the zinc Zn and tellurium Te on the surface are oxidized so that the diffusion control layer 2 is formed as an oxide layer having a thickness of approximately 10 nm (step 4).

Aluminum Al is deposited on the surface of the aforesaid substrate 1 through the diffusion control layer 2 so that the diffusion source 3 is formed thereon (step 5). Due to the deposit of the diffusion source 3, aluminum Al of the diffusion source 3 is further oxidized by oxygen by which the aforesaid zinc Zn and tellurium Te are oxidized, resulting in formation of an Al oxide layer, and this Al oxide layer defines together with the oxide layers of the aforesaid Zn and Te the diffusion control layer 2 as the oxide layer as a whole having a thickness of several ten nm.

The substrate 1, on which the aforesaid diffusion control layer 2 and diffusion source 3 are laminated, is set in a diffusion oven, and aluminum of the diffusion source 3 is subjected to a thermal diffusion process, and is doped in the substrate 1 through the diffusion control layer 2 in an hydrogen atmosphere under a heating condition that the temperature of 380° C. is maintained over the time period of 5 hrs (step 6). In this thermal diffusion process, as shown in FIGS. 3(A) and 3(B), a 100% aluminum Al density of the diffusion source 3 is gradually subjected to a thermal diffusion through the diffusion control layer 3 of the oxide layer. Thus, Al which is an n-type impurity is thermally diffused in the p-type ZnTe of the substrate 1 as the density thereof decreases in accordance with the thickness of the diffusion control layer 2, the diffusion coefficient of Al at the diffusion control layer 2 and so on, whereby it is possible to control a diffusion depth thereof.

Namely, it is found that a surface density of Al for causing the conversion of the p-type ZnTe of the substrate 1 into the n-type ZnTe can be set in a range of Q(%) to 100(%) due to the thickness of the diffusion control layer 2 and so on, whereas, in the prior art semiconductor element manufacturing method, the control is only carried out in a narrow range of R(%) (R>Q) to 100(%), as shown in the characteristic diagram of the Al-density/diffusion-depth.

Like this, according to the semiconductor element manufacturing method of the present embodiment, since the control can be carried out in the wide range due to the diffusion control layer 2 composed of the oxide layer, it is possible to previously determine the diffusion depth in the substrate 1 by optionally regulating the thickness and the physical properties of the diffusion control layer 2, whereby a doping region and a doping density regarding the n-type ZnTe can be independently produced preciously and accurately.

After the thermal diffusion process, palladium is deposited on the back surface of the substrate 1 as a p-type ohmic electrode 5, and an alloying process is carried out, resulting in production of a light emitting diode (step 7).

It is found that the light emitting diode thus produced features a very larger light emission in comparison with the prior art light emitting diode without the provision of the oxide layer, and that there are almost no fluctuations among the chips. As expected at the beginning, it is presumed that the diffusion density becomes smaller in comparison with the case without the provision of the diffusion control layer 2 of the oxide layer, due to the fact that the diffusion of Al is carried out through the diffusion control layer 2 of the oxide layer, so that an appropriate n-type ZnTe is produced. The Al density of the diffusion source 2 was analyzed by a secondary ion mass analyzer, and the analysis results supporting the presumption were obtained. Also, the reason why the fluctuations are improved in comparison with a prior art method, in which Al is directly deposited on a wet-etched ZnTe substrate, is because a surface of the ZnTe substrate is ununiformly oxidized and contaminated until the ZnTe substrate is set in the vacuum evaporation apparatus after the wet-etching when carrying out the direct deposition, whereas the substrate 1 has a uniform surface defined thereon, due to the fact that the oxide layer of the diffusion control layer 3 is deposited on the substrate 1 after the cleaning process as stated in the explanation of the present embodiment, so that the diffusion source 3 formed later thereon has also a uniformity.

(Other Embodiments of the Invention)

Semiconductor element manufacturing methods of other embodiments of the present invention may be constituted as stated below.

The formation of the aforesaid diffusion control layer 2 may be carried out so that the thickness of the diffusion control layer becomes thicker as a solid solubility limit of the element of the diffusion source 3 becomes larger.

Like this, in the present embodiment, by either selecting a material substance of an oxide layer or a nitride layer or setting a thickness thereof, it is possible to independently control preciously and accurately a diffusion depth and a diffusion density in a semiconductor region formed between the substrate 1 and the diffusion control layer 2, whereby a semiconductor element can be preciously and accurately manufactured.

In the above-mentioned embodiment, although a current may flow through the oxide layer of the diffusion control layer 2 due to the tunnel effect because the oxide layer forming the diffusion control layer 2 has the very small thickness of several nm to several ten nm, an influence exerted on the electric characteristic is not recognized. However, if any influence is recognized, it is possible to remove the oxide layer of the diffusion control layer 2 after the thermal diffusion process.

Also, in the present embodiment, although the oxide layer is referred to by way of example, the diffusion control layer is not limited to the oxide layer. The diffusion control layer may be formed as a layer, which is composed of an element having a smaller diffusion rate than that of a donor impurity such as Al or the like, for example a nitride layer. Also, by regulating a thickness of the layer, it is possible to control the impurity in the diffusion source 3.

Further, the semiconductor element manufacturing methods of the other embodiments are not limited to a manufacture of the ZnTe light emitting diode, and can be applied to production of all electronic devices by using the thermal diffusion process, such as production of photoelectron devices based on a II-VI group compound semiconductor such as Zn, ZnSe, CdTe or the like and based on a III-V group compound semiconductor such as GaAs, InAs, GaN, InN or the like, photoelectron devices based on a semiconductor such as Si, C, Ge, Si or the like, and so on.

Note, in the semiconductor element manufacturing methods of the other embodiments, an optional conductivity element forming the diffusion source 3 is not limited to the metal Al, and may be an alloy containing Al, Ga, In, Cl, Br, I, B or a mixture of these elements.

EXPLANATION OF REFERENCES 1, 4 substrate
2 diffusion control region
3 diffusion source
5 p-type ohmic electrode
101 p-type ZnTe monocrystal substrate
102 diffusion source
103, 104 diffusion region
105 p-n junction

The invention claimed is:

1. A semiconductor element manufacturing method comprising:

laminating a diffusion control layer between a substrate of a first conductivity type and a diffusion source, said diffusion control layer being in direct contact with the entire surface area of said substrate, and thereafter;

thermally diffusing an impurity from said diffusion source into said substrate to a diffusion depth, a PN junction in said substrate being formed at said diffusion depth, wherein said impurity diffuses through said diffusion control layer to change a layer in the substrate to a second conductivity type, said second conductivity type being opposite to said first conductivity type, wherein said substrate is formed of a semiconductor crystal and said diffusion control layer is a layer of a substance, a diffusion coefficient of the substance through said semiconductor crystal being smaller than a diffusion coefficient of the impurity through said semiconductor crystal.

2. The semiconductor element manufacturing method as set forth in claim 1, wherein said first conductivity type is p-type and said second conductivity type is n-type.

3. The semiconductor element manufacturing method as set forth in claim 1, wherein said diffusion source is a layer of aluminum, said substance is $Al_2O_3$ and said semiconductor crystal is ZnTe.

4. The semiconductor element manufacturing method as set forth in claim 1, wherein said substance is an oxide or a nitride.

5. The semiconductor element manufacturing method as set forth in claim 1, wherein said impurity is said aluminum.

6. The semiconductor element manufacturing method as set forth in claim 1, wherein said semiconductor crystal is a II-VI group compound.

7. The semiconductor element manufacturing method as set forth in claim 1, wherein the thickness of said diffusion control layer determines said diffusion depth.

8. The semiconductor element manufacturing method as set forth in claim 1, wherein said layer of the substrate extends from a front surface of the substrate to said diffusion depth.

9. The semiconductor element manufacturing method as set forth in claim 1, wherein a diffusion concentration is the concentration of said impurity in said layer of the substrate, the thickness of said diffusion control layer determining said diffusion concentration.

10. The semiconductor element manufacturing method as set forth in claim 1, wherein said diffusion control layer has a thickness of 0.1 nm to 100 nm.

11. The semiconductor element manufacturing method as set forth in claim 1, wherein said the thickness of said diffusion control layer becomes thicker as a solid solubility limit of said impurity becomes larger.

12. The semiconductor element manufacturing method as set forth in claim 1, further comprising:

depositing palladium onto a back surface of the substrate.

* * * * *